(12) United States Patent
Tsuchida et al.

(10) Patent No.: US 8,568,856 B2
(45) Date of Patent: Oct. 29, 2013

(54) TWO-LAYER FLEXIBLE SUBSTRATE

(75) Inventors: Katsuyuki Tsuchida, Kitaibaraki (JP); Hironori Kobayashi, Kitaibaraki (JP); Ryu Murakami, Kitaibaraki (JP); Masashi Kumagai, Kitaibaraki (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 0 days.

(21) Appl. No.: 11/992,209

(22) PCT Filed: Aug. 22, 2006

(86) PCT No.: PCT/JP2006/316388
§ 371 (c)(1),
(2), (4) Date: Mar. 18, 2008

(87) PCT Pub. No.: WO2007/039992
PCT Pub. Date: Apr. 12, 2007

(65) Prior Publication Data
US 2009/0092789 A1    Apr. 9, 2009

(30) Foreign Application Priority Data
Oct. 5, 2005 (JP) ................. 2005-292183

(51) Int. Cl.
*D06N 7/04* (2006.01)
(52) U.S. Cl.
USPC ........................................................ 428/141
(58) Field of Classification Search
USPC ................................................ 428/141, 143
See application file for complete search history.

(56) References Cited

U.S. PATENT DOCUMENTS

| | | |
|---|---|---|
| 6,962,726 B2 | 11/2005 | Shigeta et al. |
| 2004/0140551 A1* | 7/2004 | Usui et al. ............... 257/700 |
| 2005/0142374 A1* | 6/2005 | Chen et al. ............... 428/607 |

FOREIGN PATENT DOCUMENTS

| | | |
|---|---|---|
| JP | 01225392 A * | 9/1989 |
| JP | 6-45729 | 2/1994 |
| JP | 10-193505 | 7/1998 |
| JP | 2000-034594 | 2/2000 |
| JP | 2002-299777 | 10/2002 |
| JP | 2003-324258 | 11/2003 |
| JP | 2004-31370 | 1/2004 |
| JP | 2005-113183 | 4/2005 |
| TW | 521542 | 2/2003 |

OTHER PUBLICATIONS

Abstracts_of_JP_01225392_A; Urakuchi, Yoshinori; Manufacture of Multilayer Printed Wiring Board; Mar. 4, 1988; JPO; Abstract.*

* cited by examiner

*Primary Examiner* — David Sample
*Assistant Examiner* — Tahseen N Khan
(74) *Attorney, Agent, or Firm* — Flynn, Thiel, Boutell & Tanis, P.C.

(57) ABSTRACT

The invention provides a two-layer flexible substrate free of surface defects and having excellent etching characteristics and adherence to a resist.
The two-layer flexible substrate has a copper layer provided on one or both faces of an insulator film without using an adhesive, wherein the surface roughness (Ra) of the copper layer is 0.10 to 0.25 μm, and wherein the average crystal grain size [of copper] is no greater than 0.8 μm at 1 μm from the insulator film in the cross-section of the copper layer. Preferably, the insulator film is a polyimide film.

6 Claims, 1 Drawing Sheet

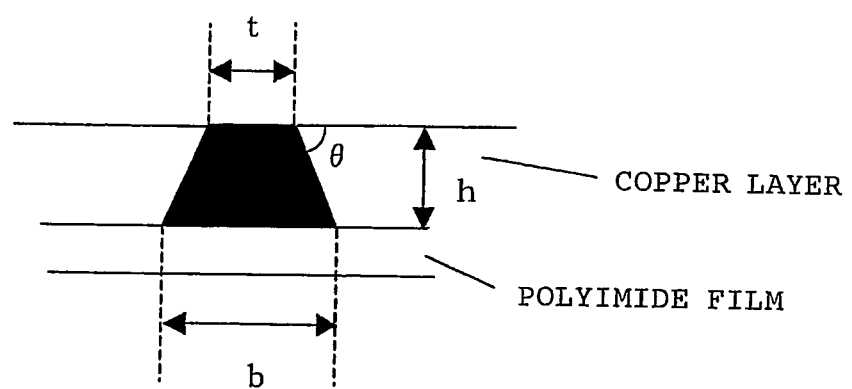

TWO-LAYER FLEXIBLE SUBSTRATE

BACKGROUND OF THE INVENTION

1. Field of the Invention

The present invention relates to a two-layer flexible substrate, and more particularly, to a two-layer flexible substrate in which a copper layer is formed on an insulator film.

2. Description of the Related Art

Two-layer flexible substrates have attracted attention as substrates used in the manufacture of flexible printing wiring boards. Two-layer flexible substrates, in which a copper conductor layer is provided directly on an insulator film without using an adhesive, are advantageous in that the substrate can be made thinner thereby, while allowing the arbitrary adjusting of the thickness of the copper conductor layer to be formed. Such two-layer flexible substrates are ordinarily manufactured by forming an underlying metal layer on an insulator film, followed by electrolytic copper plating. However, underlying metal layers obtained that way exhibit numerous pinholes and areas where the insulator film is exposed. In the case where a thin-film copper conductor layer is provided thereon, the thin-film copper conductor layer fails to bury the exposed areas of the pinholes, with pinholes occurring also on the surface of the copper conductor layer, all of which may give rise to wiring defects. To solve the above problem, there have been proposed methods for forming a two-layer flexible substrate, for instance as disclosed in Japanese Patent Publication No. H10-193505A, comprising the steps of forming an underlying metal layer on an insulator film by dry plating, forming next a primary electrolytic copper plating layer on the underlying metal layer, carrying out then an alkaline solution treatment, forming thereafter an electroless copper plating layer, and forming lastly a secondary electrolytic copper plating layer. Such a method, however, relies on a complex set of operations.

There is a growing requirement for copper layers to enable fine patterning, on account of the trend in recent years towards printed wiring boards having higher densities, narrower circuit widths, and higher layer counts. Fine patterning thus requires copper layers having high etching rates and uniform solubility, i.e. copper layers having excellent etching characteristics.

Upon formation of wiring through coating of a resist on the copper layer and further plating, the high gloss of the copper surface may give rise to resist delamination. Two-layer flexible substrates must thus have an excellent adherence to the resist.

DISCLOSURE OF THE INVENTION

An object of the present invention is to provide a two-layer flexible substrate free of surface defects and having excellent etching characteristics and adherence to a resist.

As a result of research on etching characteristics and adherence to a resist of two-layer flexible substrates, it was found out that a two-layer substrate free of surface defects and having excellent etching characteristics and adherence to a resist is achieved by prescribing the surface roughness (Ra) of a copper layer and the crystal grain size at a cross-section of the copper layer.

Specifically, the present invention is:

(1) A two-layer flexible substrate having a copper layer provided on one or both faces of an insulator film without using an adhesive, wherein the surface roughness (Ra) of the copper layer is 0.10 to 0.25 and the wherein the average crystal grain size of copper is no greater than 0.8 μm at a cross-section of the copper layer 1 μm from the insulator film.

2) The two-layer flexible substrate according to (1) wherein the insulator film is a polyimide film.

A two-layer flexible substrate having excellent etching characteristics and adherence to a resist can be obtained by prescribing the surface roughness (Ra) of the copper layer and the crystal grain size of copper in the cross-section of the copper layer of the two-layer flexible substrate.

The prescribed surface roughness is not detrimental to fine-line formation. Also, the substrate is free of surface defects, which enhances the yield.

BRIEF DESCRIPTION OF THE DRAWINGS

FIG. 1 is a diagram for explaining a formula for determining an etching ratio.

BEST MODE FOR CARRYING OUT THE INVENTION

The two-layer flexible substrate of the present invention is a substrate in which a copper layer is formed on an insulator film, preferably a substrate obtained by forming an underlying metal layer on an insulator film, and by forming then a copper layer of a predefined thickness by electroplating.

As the insulator film of the present invention there can be used a film comprising a thermosetting resin such as a polyimide resin, a polyester resin, a phenolic resin or the like, a thermoplastic resin such as a polyethylene resin or the like, a condensation polymer such as a polyamide or the like, as well as a mixture of two or more of the foregoing. Preferred herein is, for instance, a polyimide film or a polyester film, in particular a polyimide film. Various polyimide films may be used as the polyimide film, for instance Kapton (DuPont-Toray Co., Ltd.), Upilex (Ube Industries Co., Ltd.) or the like.

Preferably, the thickness of the insulator film is 10 to 50 μm.

The underlying metal layer comprising single elements such as Ni, Cr, Co, Ti, Cu, Mo, Si, V or mixed systems thereof, can be formed on the insulator film in accordance with known methods such as vapor deposition, sputtering, plating or the like.

The preferred thickness of the underlying metal layer is 10 to 500 nm.

The two-layer flexible substrate of the present invention explained thus far is obtained by forming an underlying metal layer on an insulator film, and forming then a copper plated layer using known electroplating methods.

An ordinary acid copper plating solution can be used herein as the plating solution. Preferably, there is used an aqueous solution obtained by mixing a copper sulfate aqueous solution with chlorine, a nonionic surfactant, and a sulfur-containing organic compound, as additives. The copper layer formed has preferably a thickness of 3 to 30 μm.

The nonionic surfactant is preferably a polyether such as polyethylene glycol, polypropylene glycol or the like.

The above sulfur-containing organic compound is preferably a compound having a structural formula represented by formulas (1) or (2) below.

$$X-R^1-(S)_n-R^2-Y \tag{1}$$

$$R^4-S-R^3-SO_3Z \tag{2}$$

(In formulas (1) and (2), $R^1$, $R^2$ and $R^3$ are a $C_1$ to $C_8$ alkylene group, $R^4$ is selected from the group consisting of hydrogen, and

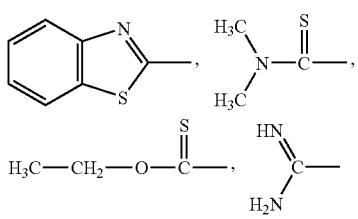

X is selected from the group consisting of hydrogen, a sulfonic acid group, a phosphonic acid group, an alkaline metal base or an ammonium base of sulfonic acid or phosphonic acid, Y is selected from the group consisting of a sulfonic acid group, a phosphonic acid group and an alkaline metal base of sulfonic acid or phosphonic acid, Z is hydrogen or an alkaline metal, and n is 2 or 3.)

For instance, the following compounds are preferably used as the sulfur-containing organic compound represented by formula (1).

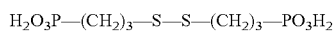

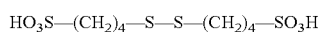

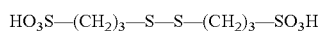

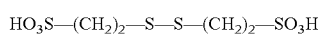

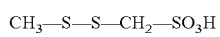

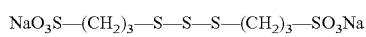

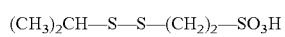

For example, the following compounds are preferably used as the sulfur-containing organic compound represented by formula (2).

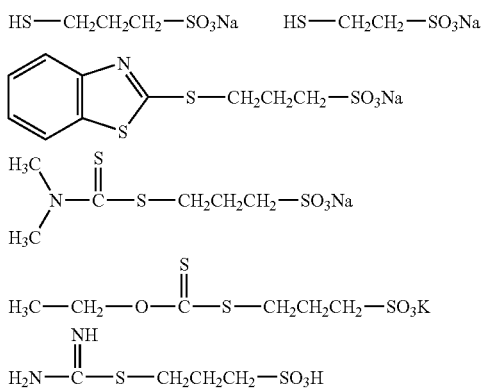

The surface roughness (Ra) of the copper layer is 0.10 to 0.25 μm, preferably 0.12 to 0.24 μm.

The above surface roughness range (moderately rough surface) affords good adherence to a solder resist. When the surface is a glossy surface, setting the surface roughness to lie within the above range causes small protrusions or depressions, which give rise to defects, to be disguised by the roughness, thus eliminating small defects on the surface and increasing yields. A surface roughness (Ra) ranging from 0.10 to 0.25 μm is compatible with fine line requirements.

The surface roughness of the copper layer which is obtained through normal plating is smaller than 0.1 μm or greater than 0.25 μm. A glossy article with surface roughness smaller than 0.1 μm is obtained by further adding a nitrogen-containing compound in addition to the additives of the above plating solution. Articles with a surface roughness exceeding 0.25 μm are obtained using a copper sulfate aqueous solution (without using additives). In the present invention, the above range can be achieved by plating using, as the plating solution, an aqueous solution obtained by adding chlorine, a nonionic surfactant and a sulfur-containing organic compound to a copper sulfate aqueous solution, and by plating in a manner in which the current density is gradually increased. A preferred specific method involves herein, for instance, using the above plating solution, having added thereto 0.1 to 1000 ppm each of a nonionic surfactant and a sulfur-containing organic compound, and increasing gradually the current density, continuously or in about 2 to 10 stages, within a range of 0.1 to 50 A/dm$^2$. Preferably, the plating temperature is 20 to 70° C. In this plating method, the crystal grain size of the copper gradually increases with distance from the insulator film, being smaller the closer it is to the insulator film.

The average crystal grain size of copper is no greater than 0.8 μm, preferably of 0.2 to 0.7 μm, at a position of the copper layer 1 μm from the insulator film.

In the present invention, as described above, the average crystal grain size of copper decreases with the distance from the surface of the insulator film. Accordingly, if the average crystal grain size of copper at a distance of 1 μm from the insulator film is no greater than 0.8 μm, the average crystal grain size is smaller than that at a distance less than 1 μm from the insulator film.

Etching characteristics in the vicinity of the insulator film are important for fine pattern formation. Fine patterning is made possible herein by setting the average crystal grain size of copper in the copper layer to be no greater than 0.8 μm up to a position 1 μm from the insulator film. The smaller the grain size, the better the etching characteristics become. That is, etching is facilitated by reducing the crystal grain size in the vicinity of the insulator film. This curbs side etching and enhances the etching characteristics.

Although the crystal grain size of copper in the vicinity of the insulator film exceeds 0.8 μm if manufactured by bright plating using ordinary copper sulfate, the crystal grain size can be made smaller, no greater than 0.8 μm, by changing the various additives, controlling current density and plating temperature, as described above.

The average crystal grain size of copper at a distance of 1 μm from the insulator film can be determined, for instance, through observation and/or measurement of the crystal grain size, by SIM observation after FIB cutting.

In the two-layer flexible substrate of the present invention, in which the underlying metal layer is formed in accordance with ordinary methods, even if pinholes occur in the underlying metal layer, no pinholes develop on the copper conductor layer surface, and hence the two-layer flexible substrate is free of surface defects. The detailed mechanism for this effect is not understood, but presumably pinholes can be buried by copper as a result of setting the average crystal grain size of copper to be no greater than 0.8 μm at a position of 1 μm from the insulator film.

EXAMPLES

The invention is explained next based on examples. The invention, however, is in no way meant to be limited to or by these examples.

Examples 1 to 2, Comparative Examples 1 to 3

Polyimide films having an underlying metal layer were electroplated under the plating conditions below to prepare copper layers about 8 μm thick. The additives and the amounts thereof are given in Table 1.

Solution volume: about 800 ml
Anode: lead electrode
Cathode: rotating electrode with polyimide film coiled thereon
Polyimide film having an underlying metal layer: obtained by sputtering NiCr 10 nm thick+Cu 2000 Å thick on 37.5 μm-thick Kapton E (DuPont).
Current duration: 1300 As
Current density: 5→10→20→30 A/dm² variation (each current density held for 40 seconds)
Flow rate: 190 rpm
Cu: 70 g/L
$H_2SO_4$: 60 g/L
Cl: 75 ppm The surface roughness (Ra) (μm) (arithmetic average roughness) of the obtained copper polyimide two-layer substrates was measured in accordance with JIS B 0601. The average crystal grain size of copper at a position 1 μm from the polyimide film was determined. The number of defects, the etching characteristic and adherence to resist were evaluated as well.

Average Crystal Grain Size:

The average crystal grain size was determined as the average value of crystal grain size of a portion (10 μm wide) at 1 μm from the polyimide film, by FIB-cutting the obtained copper polyimide two-layer substrates and observing subsequently the slice cross-section. The results are given in Table 1.

Number of Defects:

The number of defects was determined by visually counting the number of defects (number of small protrusions and depressions) on 1 dm² of the copper layer surface. The results are given in Table 1.

Etching Characteristics:

Etching characteristics were evaluated based on an etching ratio. The etching ratio was calculated using the expression below after forming 20 μm-pitch lines.

Etching ratio=$h/\{(b-t)/2\}(=\tan\theta)$

As illustrated in FIG. 1, h=etching depth, b=etching width on the substrate surface, and t=etching width on the etching bottom surface. The results are given in Table 1.

Evaluation of Adherence to Resist:

Adherence to resist was evaluated based on electroless plating resistance. A commercially available solder resist was applied on the substrates obtained in Examples 1 and 2 and Comparative examples 1 and 2. Evaluation substrates were prepared then through curing after exposure and development. The evaluation substrates were plated using a commercially available electroless Ni plating solution and electroless gold plating solution. A peel test with Sellotape™ was then carried out on the evaluation substrates after plating, to assess resist peel. In the substrates of Examples 1 and 2 no peel was observed at all on the resist, while the substrates of Comparative examples 1 and 2 exhibited slightly visible peels.

TABLE 1

| | Additive | Plating temperature (° C.) | Surface roughness (Ra) (μm) | Average crystal grain size (μm) | Number of defects | Etching ratio |
|---|---|---|---|---|---|---|
| Example 1 | SPS (30 ppm) PEG (50 ppm) | 40 | 0.15 | 0.6 | 0 | 4.0 |
| Example 2 | SPS (30 ppm) PEG (50 ppm) | 50 | 0.24 | 0.4 | 0 | 4.3 |
| Comparative example 1 | SPS (15 ppm) PEG (50 ppm) JGB (30 ppm) | 50 | 0.09 | 1.6 | 5 | 2.4 |
| Comparative example 2 | SPS (30 ppm) PEG (50 ppm) JGB (30 ppm) | 50 | 0.07 | 0.9 | 10 | 3.6 |
| Comparative example 3 | SPS (30 ppm) | 50 | 0.26 | Not measured | 0 | 1.6 |

SPS: bis-(3-sodiumsulfopropyl disulfide)
PEG: polyethylene glycol
JGB: Janus green B (nitrogen-containing compound)

The above results show that the copper polyimide two-layer substrate of the present invention is free of surface defects and has excellent etching characteristics and adherence to resist.

What is claimed is:

1. A layered flexible substrate comprising a copper layer provided on one or both faces of an insulator film without using an adhesive, wherein the surface roughness (Ra) of the copper layer is 0.10 to 0.25 μm and the average crystal grain size of the copper is no greater than 0.8 μm up to a position of 1 μm from the insulator film in the cross-section of the copper layer and the copper layer has a glossy surface and is free of surface defects.

2. The layered flexible substrate according to claim 1, wherein the insulator film is a polyimide film.

3. The layered flexible substrate according to claim 1, wherein the average crystal grain size of copper is from 0.2 to 0.7 μm at a distance less than 1 μm from the insulator film.

4. The layered flexible substrate according to claim 1, wherein the surface roughness (Ra) of the copper layer is from 0.12 to 0.24 μm and the average crystal grain size of the copper is from 0.2 to 0.7 μm at 1 μm from the insulator film in the cross-section of the copper layer.

5. The layered flexible substrate according to claim 1, wherein the insulator film is a polyester film.

6. The layered flexible substrate according to claim 1, consisting of the insulator film, an underlying metal layer formed on the insulator film and the copper layer formed on the underlying metal layer.

* * * * *